United States Patent [19]

Wilson et al.

[11] 4,345,697

[45] Aug. 24, 1982

[54] SEPARABLE HINGE ASSEMBLY FOR A COVER

[75] Inventors: Billy E. Wilson; Coy R. Hutson, both of Parsons, Kans.

[73] Assignee: Power-Flame, Inc., Parsons, Kans.

[21] Appl. No.: 182,654

[22] Filed: Aug. 29, 1980

[51] Int. Cl.³ .............................................. B65D 43/24
[52] U.S. Cl. ................................... 220/335; 220/337; 16/260
[58] Field of Search .................. 16/267, 268, 390, 386, 16/172, 171, 128, 266; 220/3.8, 334, 335, 337

[56] References Cited

U.S. PATENT DOCUMENTS

| | | | |
|---|---|---|---|
| 610,010 | 8/1898 | Winter | 16/172 |
| 974,953 | 11/1910 | Darlinton | 16/172 |
| 1,213,157 | 1/1917 | Conway | 220/335 |
| 2,570,992 | 10/1951 | Thomas | 16/128.1 |
| 2,767,032 | 10/1956 | Mitchell | 304/9 |
| 2,852,802 | 9/1958 | Seby | 16/135 |
| 2,969,889 | 1/1961 | Morterol | 220/6 |
| 3,348,259 | 10/1967 | Wilhelmsen et al. | 16/128 |
| 3,878,585 | 4/1975 | Morris | 16/128 |

*Primary Examiner*—George T. Hall
*Attorney, Agent, or Firm*—Roylance, Abrams, Berdo & Farley

[57] ABSTRACT

A hinge assembly which allows pivotal movement between first and second panels of at least 90° and which allows separation of the two panels anywhere along the pivotal movement. The assembly has a hinge member formed of a single piece of bent sheet metal. The hinge assembly comprises a first portion located on the first panel, a lip extending substantially perpendicularly from the first portion, and a hinge member rigidly coupled to the first panel and having an intermediate portion extending substantially perpendicularly from the first panel and a leg extending substantially perpendicularly from the intermediate portion towards the lip. The distal edge of the lip and the distal edge of the leg define a slot which receives a second portion located on the second panel to thereby pivotally couple the first and second panels.

25 Claims, 10 Drawing Figures

SEPARABLE HINGE ASSEMBLY FOR A COVER

FIELD OF THE INVENTION

The present invention relates to a separable hinge assembly which allows pivotal movement through at least 90°. The assembly can advantageously be used for a sheet metal cover coupled to a sheet metal box, such as a box containing electrical equipment. The assembly includes a hinge member formed from a bent piece of sheet metal.

BACKGROUND OF THE INVENTION

Numerous hinge assemblies are known in the prior art for thin sheet metal panels, such as those used to pivotally couple a door to a box containing electrical equipment. There are, however, numerous disadvantages to many of these prior art hinge assemblies. For example, many of these devices are not separable so that the door cannot readily be detached from the box. In addition many of these prior art devices do not limit the pivotal movement of the door relative to the box so that such relative pivotal movement varies widely in an uncontrolled manner.

Moreover, many of these prior art hinge assemblies are very expensive to form, such as for example piano hinges. In addition, such hinges require considerable time to attach to the door and the box, especially since various parts must be carefully aligned along the pivotal axis. Finally, many of the prior art hinge assemblies have intricate curved or tubular portions which require complicated manufacture and exacting tolerances.

Examples of these prior art devices are disclosed in U.S. Pat. Nos. 610,010 issued Aug. 30, 1898 to Winter; 974,953 issued Nov. 8, 1910 to Darlinton; 2,570,992 issued Oct. 9, 1951 to Thomas; 2,767,032 issued Oct. 16, 1956 to Mitchell; 2,852,802 issued Sept. 23, 1958 to Seby; 2,969,889 issued Jan. 31, 1961 to Morterol; 3,348,259 issued Oct. 24, 1967 to Wilhelmsen et al; and 3,878,585 issued Apr. 22, 1975 to Morris.

SUMMARY OF THE INVENTION

Accordingly, a primary object of the present invention is to provide a separable hinge assembly with a controlled degree of pivotal movement that is inexpensive to manufacture.

Another object of the present invention is to provide such a hinge assembly which does not require complicated manufacturing steps or exacting tolerances.

Another object of the present invention is to provide a hinge assembly which is easily aligned during formation of the hinged combination.

The foregoing objects are basically attained by providing a hinge assembly for first and second panels, the combination comprising a first portion located on the first panel; a lip extending from the first portion and having a distal edge; a second portion located on the second panel; a hinge member; means for rigidly coupling the hinge member to the first panel, the hinge member comprising a leg, and an intermediate portion extending from the first panel and having the leg extending therefrom, the leg having a distal edge forming a slot with the distal edge of the lip, which slot receives the second portion therein, the second portion being in contact with the lip when the first and second portions are substantially perpendicular, and the second portion being in contact with the leg when the first and second portions are at an angle of at least 180°.

Advantageously, the hinge member is a single piece of sheet metal bent in two places to form a base portion, an intermediate portion extending from the base portion and the leg extending from the intermediate portion. The base portion can be spot welded to the first panel. In addition, advantageously the lip extends substantially perpendicularly from the first portion and the leg extends substantially perpendicularly from the intermediate portion, which in turn extends substantially perpendicularly from the first panel.

Since the second portion is received in the slot formed by the lip and the leg, the hinge assembly is separable at any point along the pivotal movement thereof.

When the first and second portions are substantially perpendicular, the outer surface of the second portion abuts the inner surface of the lip and the distal edge of the leg abuts the inner surface of the second portion thereby forming a stop against additional pivotal movement. In addition, when the first and second portions are substantially parallel, the outer surface of the second portion abuts the distal edge of the lip and the inner surface of the second portion abuts the inner surface of the leg, thereby acting as a stop against additional pivotal movement.

Other objects, advantages and salient features of the present invention will become apparent from the following detailed description which, taken in conjunction with the annexed drawings, discloses preferred embodiments of the present invention.

DRAWINGS

Referring now to the drawings which form a part of this original disclosure:

DETAILED DESCRIPTION OF THE INVENTION

Figure 1:
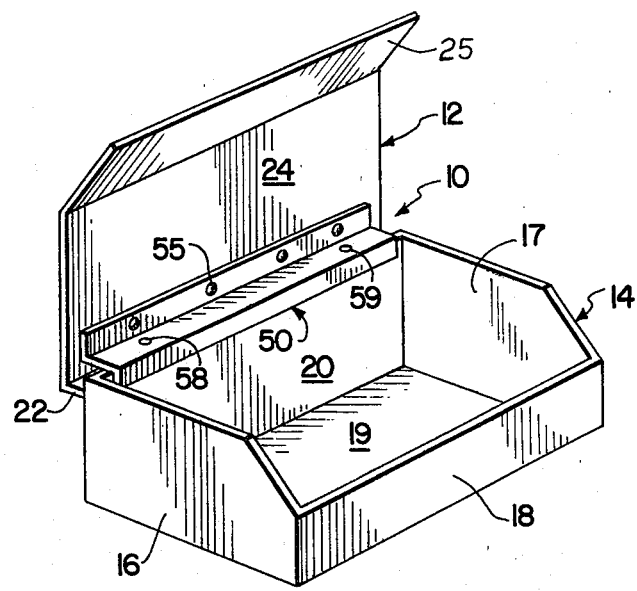
FIG. 1 is a perspective view of a sheet metal box having a cover pivotally coupled thereto with a hinge assembly in accordance with the present invention.

As seen in FIG. 1, the hinge assembly 10 in accordance with the present invention hingedly couples a cover 12 to a box 14. Both the cover and the box are advantageously formed from sheet metal. As seen in FIG. 1, the box comprises a left side panel 16, a right side panel 17, a front panel 18, a bottom panel 19, and a rear panel 20. Each of these panels is substantially planar throughout its height and width. The cover 12 has a planar rectangular central panel 24 and a downwardly sloping forward part 25 which is received on the downwardly sloping front parts of the left and right side panels 16 and 17. In addition, a lip 22 extends downwardly substantially perpendicularly from the rear of the central panel 24 of the cover 12. Although not shown, the cover can be conventionally secured in the closed position where it abuts the top edges of the side panels by means of metal screws passing therethrough to suitable flanges on the side panels or by other conventional means.

Figure 2:
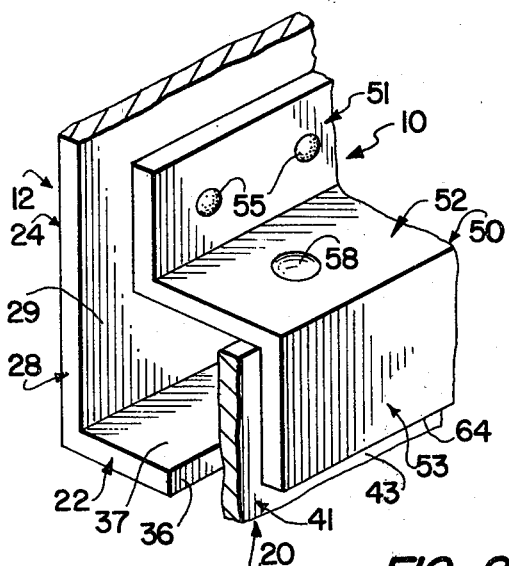
FIG. 2 is an enlarged, fragmentary perspective view of the hinge assembly in accordance with the present invention in the same position shown in FIG. 1 with the first and second portions of two panels being parallel.
Figure 3:
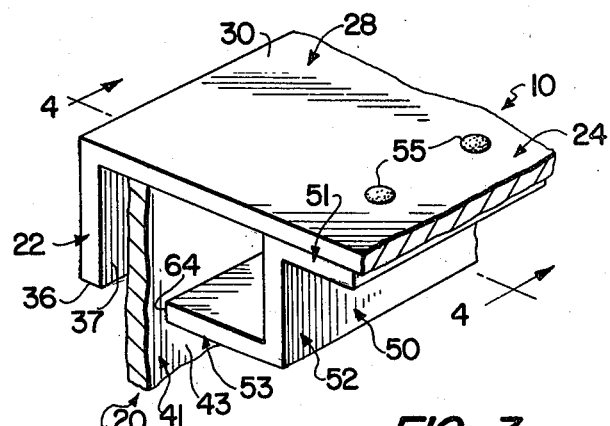
FIG. 3 is an enlarged, fragmentary perspective view of the hinge assembly shown in FIG. 2 except that the first and second portions have pivoted through 90° to a relative perpendicular position.
Figure 4:
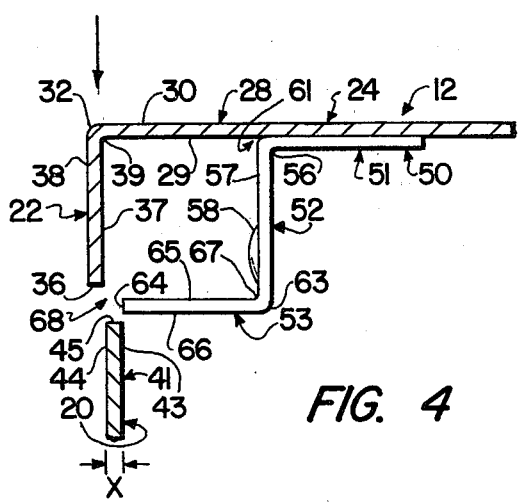
FIG. 4 is a side elevational view in section taken along lines 4—4 in FIG. 3 except that the hinge assembly is in the separated position.

As is evident from FIGS. 1-3, the hinge assembly 10 pivotally couples the cover 12 and the rear panel 20 of the box 14. In particular, referring to the central panel 24 of the cover 12 as a first panel and the rear panel 20 of the box 14 as a second panel, the first panel 24 has a first portion 28 near the end thereof which, as seen in FIGS. 2-4, has a substantially planar inner surface 29 and a substantially planar outer surface 30 which are parallel, thereby making the first portion 28 substantially planar itself. Extending substantially perpendicularly from the first portion 28 at bend line 32 is the lip 22 having a flat, straight distal edge 36 and a substantially planar inner surface 37 and a substantially planar outer surface 38 which are parallel, thereby making the lip substantially planar itself. A corner 39 is defined by the intersection of the inner surface 37 of the lip 22 and the inner surface 29 of the first portion 28.

As seen in FIGS. 2-4, the second panel 20 has a second portion 41 at the end thereof with a substantially planar inner surface 43 and a substantially planar outer surface 44 which are substantially parallel making the second portion 41 itself substantially planar. A flat straight distal edge 45 is located at the end of the second portion 41.

As seen in FIG. 4, the thickness of the second portion 41 is designated x.

Figure 8:
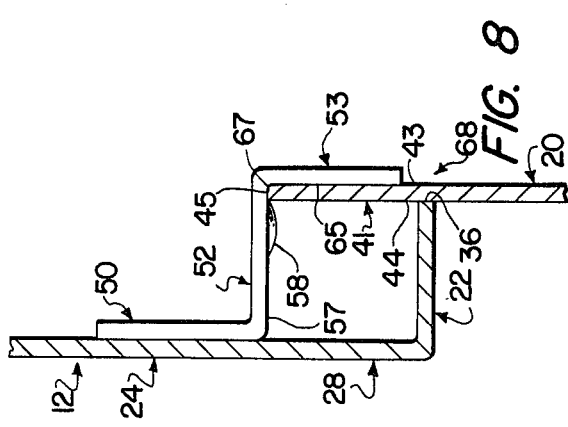
FIG. 8 is a view similar to that shown in FIG. 7 except that the first and second portions have been pivoted into a substantially parallel position with the second portion being locked in a corner defined by the intermediate portion and the leg by means of a plurality of detents.

As seen in FIGS. 1-4, a hinge member 50 is rigidly coupled to the first panel 24 and comprises a base portion 51, an intermediate portion 52 and a leg 53 integrally formed from a single piece of sheet metal. The base portion 51 is advantageously rigidly coupled to the first panel 24 by means of spot welds represented in FIGS. 1-3 by reference numeral 55. The base portion 51 is preferably planar and has the intermediate portion 52 extending substantially perpendicularly therefrom along bend line 56, the intermediate portion 52 being substantially parallel to the lip 22 and substantially perpendicular to the first panel 24. The intermediate portion 52 has a substantially planar inner surface 57 which is interrupted by a plurality of detents 58 and 59 seen in FIGS. 1 and 2 which are advantageously formed by a downward punching into the sheet metal of the intermediate portion 52. Thus, the detents extend from the inner surface 57 of the intermediate portion as outward ribs, the detents being spaced from leg 53 a distance at least equal to the thickness x of the second portion 41 at its end. This is to lock the second portion 41 in a substantially parallel position relative to the first portion 28 as seen in FIG. 8 and as described in more detail hereinafter.

As seen in FIG. 4, a corner 61 is formed at the intersection of the inner surface 57 of the intermediate portion 52 and the inner surface 29 of the first portion 28. It is this corner 61 and along the first panel 24 to the lip 22 which basically defines the first portion 28 of the first panel 24.

As seen in FIGS. 2-4, the leg 53 extends from the intermediate portion 52 along bend line 63 and is substantially perpendicular to the intermediate portion 52, substantially perpendicular to lip 22 and substantially parallel to the first portion 28. The leg 53 extends from the intermediate portion 52 towards the lip 22 but stops short thereof having a straight flat distal edge 64 which lies in a plane spaced from the plane containing the inner surface 37 of the lip a distance at least equal to the thickness x of the second portion 41.

The leg 53 has a substantially planar inner surface 65 and a substantially planar outer surface 66, the inner surface 65 forming with the inner surface 57 of intermediate portion 52 a corner 67. The inner and outer surfaces 65 and 66 are substantially parallel to each other thereby making the leg 53 substantially planar itself.

A slot 68 as best seen in FIG. 4 is defined between the distal edges 64 of the leg 53 and 36 of lip 22. It is this slot 68 that receives the second portion 41 on the second panel 20 and along which the pivotal movement of these two panels takes place.

The flat, straight distal edge 36 of lip 22 lies in a plane which is parallel to and spaced from the plane containing the substantially planar inner surface 65 of the leg 53 as best seen in FIGS. 3, 4 and 8. This spacing is at least equal to the thickness x of the second portion 41.

Figure 5:
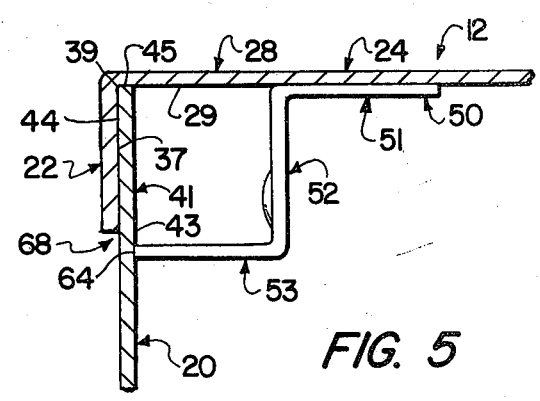
FIG. 5 is a view similar to that shown in FIG. 4 except that the hinge assembly is in the connected configuration with the two portions on the two panels being perpendicular.

As best seen in FIGS. 4 and 5, the combination of the intermediate portion 52, leg 53, lip 22 and first portion 28 forms a tubular body with a substantially square cross-section except for the slot 68 formed therein. The length of lip 22 plus the thickness of the second portion 41 is substantially equal to the length of the intermediate portion 52. Similarly, the length of leg 53 plus the thickness of the second portion 41 is substantially equal to the length of the first portion 28. The length of the leg 53 plus the thickness of the second portion 41 is also substantially equal to the length of the intermediate portion 52 as is the length of the first portion 28.

Advantageously, the first panel 24, the second panel 20 and the hinge member 50 are formed from sheet metal of 16 gauge cold roll steel having a thickness of 0.0625 inches.

CONSTRUCTION AND OPERATION

As seen in FIG. 5, the combination of the first panel 24 and the hinge member 50 is easily connected with the second panel 20 by sliding the second portion 41 of second panel 20 through the slot 68 with the first and second panels 24 and 20 being substantially perpendicular. This is easily accomplished since the space between the inner surface 37 of lip 22 is spaced from the distal edge 64 of leg 53 by at least a distance equal to the thickness of the second portion 41. In the position shown in FIG. 5, the first and second panels 24 and 20 and therefore the first and second respective portions 28 and 41 thereof remain in the substantially perpendicular position because of abutting contact of the distal edge 64 of leg 53 against the inner surface 43 of second portion 41 and such abutting contact of the outer surface 44 of the second portion 41 with the inner surface 37 of the lip 22. In addition, the distal edge 45 of the second portion 41 is in engagement with the inner surface 29 of the first portion 28 in corner 39 between the first portion 28 and the lip 22.

Advantageously, there can be some play in this connection with regard to the dimensions of the leg, lip, intermediate portion and first portion, but in all events the connection of the first portion 28 and the second portion 41 is such that these portions are substantially perpendicular.

Figure 6:
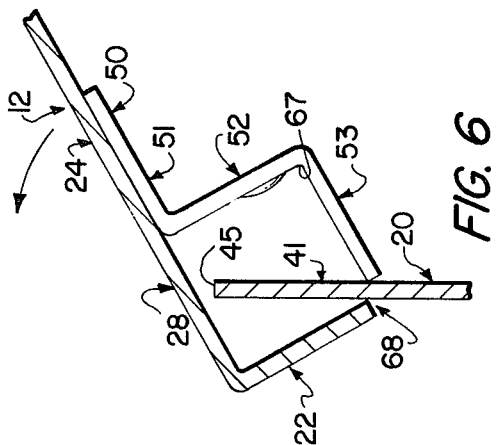
FIG. 6 is a view similar to that shown in FIG. 5 except that the first and second portions have been pivoted out of the perpendicular position.

As seen in FIG. 6, the first portion 28 and the second portion 41 can be pivoted relatively with the second portion 41 being located in the slot 68, this slot defining the pivot axis of the hinge assembly. This is accomplished by, for example, as seen in FIG. 1, pivoting the first panel 24 relative to the fixed second panel 20 on the box 14.

Figure 7:
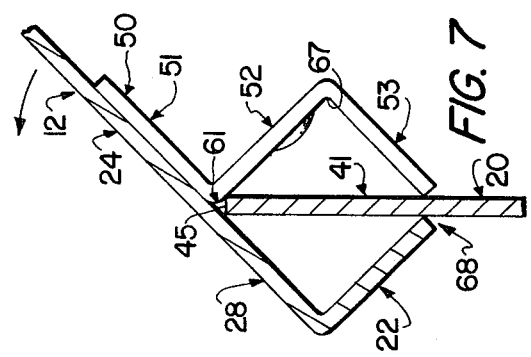
FIG. 7 is a view similar to that shown in FIG. 6 except that the second portion is received in a corner defined by the intermediate portion and the first portion.

In an intermediate position shown in FIG. 7, as long as the first panel 24 doesn't weigh too much, the first panel 24 and the second panel 20 can be fixed so that the angle between the first portion 28 and the second portion 41 is about 45°. This is accomplished by maneuvering the distal edge 45 of the second portion 41 into the corner 61 formed between the first portion 28 and the intermediate portion 52.

As seen in FIG. 8, continued pivotal motion relatively of the first and second portions 28 and 41 from the positions shown in FIGS. 6 and 7 results in a substantially parallel configuration of the first portion 28 and the second portion 41.

This substantially parallel configuration is maintained by a stopping action combining the second portion 41, the lip 22 and the leg 53. In particular, as seen in FIG. 8, the distal edge 36 of lip 22 abuts the outer surface 44 of the second portion 41 and similarly the inner surface 43 of the second portion 41 abuts the inner surface 65 of the leg 53. At the same time, the distal edge 45 of the second portion 41 abuts the inner surface 57 of the intermediate portion 52 in corner 67. This configuration is substantially locked in place by means of detents 58 and 59 abutting the second portion 41.

As seen in FIG. 8, the distance between the distal edge 36 of lip 22 and the inner surface 65 of leg 53 is substantially equal to the thickness of the second portion 41 which maintains the substantially parallel configuration of the first portion 28 and the second portion 41. This spacing can have some play in it as long as the portions 28 and 41 are substantially perpendicular.

As seen in FIG. 8, the hinge assembly is separable so that if desired the first panel 24 can be pulled off of the second panel 20 by sliding the second portion 41 out the slot 68. For that matter, the hinge assembly can be separated in any position along the pivotal movement shown in FIGS. 5-8 as desired or necessary.

Figure 10:
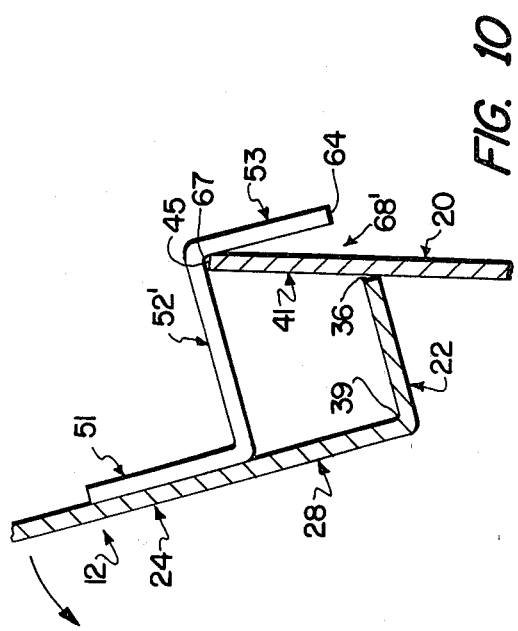
FIG. 10 is a view similar to that shown in FIG. 9 except that the first portion has been pivoted relative to the second portion through an angle of greater than 90°.
Figure 9:
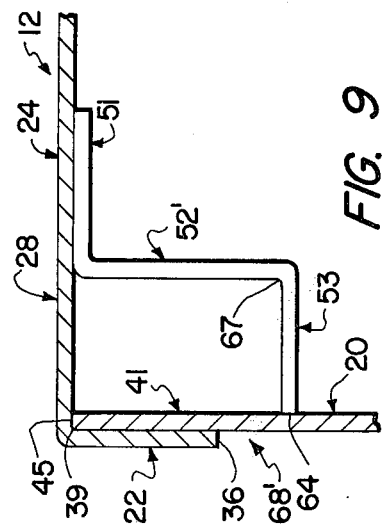
FIG. 9 is a side elevational view in section showing a modified form of the present invention with the intermediate portion having a length greater than the length of the lip.

Embodiment of FIGS. 9-10

As seen in FIGS. 9 and 10, all of the parts discussed above regarding FIGS. 1-8 are the same and are given the same reference numerals except for the intermediate portion 53' and the slot 68'.

Thus, as seen in FIGS. 9 and 10, the intermediate portion 52' is longer than lip 22 so that the slot 68' is wider than the thickness of the second portion 41.

As seen in FIG. 9, the first and second portions 28 and 41 are substantially perpendicular as in the case shown in FIG. 5.

However, upon relative pivotal movement of portions 28 and 41 the longer intermediate portion 52' allows for pivotal movement in excess of 90°. Thus, as seen in FIG. 10 the first portion 28 and the second portion 41 are not exactly parallel but instead open at a relative angle of greater than 180°. By using such a construction, the detents 58 and 59 are not necessary to assure that the first and second portions 28 and 41 stay in the opened substantially parallel position seen in FIG. 8. In essence, the embodiment of FIGS. 9-10 provides an over-the-center of gravity configuration assuring that the first and second portions 28 and 41 and in addition the first and second panels 24 and 20 remain open for a situation such as that illustrated in FIG. 1 with a cover and a box.

In a working embodiment of the subject invention, the length of the intermediate portion 52 and the length of the leg 53 were one inch and the thickness of the sheet metal making up the first and second panels and the hinge member was 0.0625 inches, i.e., 16 gauge cold roll steel.

As seen in FIG. 1, lateral movement of the cover 12 relative to the box is limited by means of the horizontal extent of the hinge member 50. That is, the edges of the hinge member would contact the inner sides of the side panels 16 and 17 upon lateral movement. Other mechanisms can be provided to limit such lateral movement, such as flanges on the exterior sides of the first panel 24. In addition, if desired the hinge member may be loosely coupled to the box 14 by means of wires coupled to the hinge member and coupled to the box to allow some upward movement of the cover away from the box 14 while preventing complete separation.

While various advantageous embodiments have been chosen to illustrate the invention, it will be understood by those skilled in the art that various changes and modifications can be made therein without departing from the scope of the invention as defined in the appended claims. Thus, although as seen in FIG. 1, the first panel 24 is made so that it is substantially vertical when open and horizontal when closed, the first panel and box can be oriented substantially in any direction relative to the pivot axis of the hinge assembly 10 as long as the first panel 24 and cover 12 will not fall from the box 14, which would occur were the apparatus shown in FIG. 1 placed upside down. In addition, in the FIGS. 9 and 10 embodiment, leg 53 can be at an angle to intermediate portion 52' that is less than 90°; for example, the angle can be about 60°. Thus, the configuration of first portion 28, lip 22, leg 53 and intermediate portion 52' need not be substantially rectangular as seen in FIGS. 9 and 10 nor substantially square as seen in FIGS. 1-8 as long as a four-sided polygon is formed with a slot provided to receive the second portion 41 and with two sets of opposed sides forming the polygon. In the case of both FIGS. 1-8 and 9 and 10, the first set of opposed sides is comprised of the lip and the intermediate portion, and the second set of opposed sides is comprised of the leg and the first portion.

What is claimed is:

1. A hinge assembly for first and second panels, the combination comprising:
a first portion located on said first panel;
a lip extending from said first portion and having a distal edge;
a second portion located on said second panel;
a hinge member;
means for rigidly coupling said hinge member to said first panel,
said hinge member comprising
   a leg, and
   an intermediate portion extending from said first panel and having said leg extending therefrom substantially perpendicular to said lip,
   said leg having a distal edge forming a slot with said distal edge of said lip, which slot receives said second portion therein,
   said second portion being in contact with said lip when said first and second portions are substantially perpendicular,
   said second portion being in contact with said leg when said first and second portions are substantially parallel.

2. A hinge assembly according to claim 1, wherein said lip extends substantially perpendicularly from said first portion.

3. A hinge assembly according to claim 1, wherein said leg extends substantially perpendicularly from said intermediate portion.

4. A hinge assembly according to claim 1, wherein said first portion is substantially planar.

5. A hinge assembly according to claim 1, wherein said second portion is substantially planar.

6. A hinge assembly for first and second panels, the combination comprising:
a first portion located on said first panel;
a lip extending substantially perpendicularly from said first portion and having a distal edge;
a second portion located on said second panel and having a distal edge;
a hinge member;
means for rigidly coupling said hinge member to said first panel,
said hinge member comprising
   a leg, and
   an intermediate portion extending substantially perpendicularly from said first panel and having said leg extending substantially perpendicularly therefrom,
   said leg having a distal edge forming a slot with said distal edge of said lip, which slot receives said second portion therein,
   said distal edge of said second portion being located in a corner defined by said first portion and said lip when said first and second portions are substantially perpendicular,
   said distal edge of said second portion being located in a corner defined by said intermediate portion and said leg when said first and second portions are substantially parallel.

7. A hinge assembly according to claim 6, wherein said lip, first portion, intermediate portion and leg form a tubular body having a substantially square cross-section.

8. A hinge assembly according to claim 6, wherein said second portion has substantially planar inner and outer surfaces,
said lip has a substantially planar inner surface, and
said leg has a substantially planar inner surface.

9. A hinge assembly according to claim 6, wherein said lip has a substantially planar inner surface which lies in a plane spaced from said distal edge of said leg by a distance at least equal to the thickness of said second portion.

10. A hinge assembly according to claim 6, wherein said leg has a substantially planar inner surface which lies in a plane spaced from said distal edge of said lip by a distance at least equal to the thickness of said second portion.

11. A hinge assembly according to claim 6, wherein said first portion and said leg are substantially equal in length.

12. A hinge assembly according to claim 6, wherein said lip and said leg are substantially equal in length.

13. A hinge assembly according to claim 6, wherein said first portion and said intermediate portion are substantially equal in length.

14. A hinge assembly according to claim 6, wherein said lip and said intermediate portion are substantially equal in length.

15. A hinge assembly according to claim 6, wherein said intermediate portion has a length greater than the length of said lip.

16. A hinge assembly according to claim 6, wherein said intermediate portion and said leg are integrally formed.

17. A hinge assembly according to claim 6, wherein said hinge member further comprises a base portion extending from said intermediate portion, and
said means for rigidly coupling said hinge member to said first panel comprises a plurality of spot welds between said base portion and said first panel.

18. A hinge assembly according to claim 6, wherein said intermediate portion has at least one detent extending from the inner surface thereof spaced from said leg a distance at least as large as the thickness of said second portion to lock said second portion and said first portion in the substantially parallel position, said second portion being received between said detent and said leg.

19. A hinge assembly according to claim 6, wherein said first portion is substantially planar.

20. A hinge assembly according to claim 6, wherein said second portion is substantially planar.

21. A hinge assembly for first and second panels, the combination comprising:
a first portion located on said first panel;
a lip extending from said first portion and having a distal edge;
a second portion located on said second panel;
a hinge member;
means for rigidly coupling said hinge member to said first panel,
said hinge member comprising
   a leg, and
   an intermediate portion extending from said first panel and having said leg extending therefrom,
   said leg having a distal edge forming a slot with said distal edge of said lip, which slot receives said second portion therein,
   said second portion being in contact with said lip when said first and second portions are substantially perpendicular,
   said second portion being in contact with said leg when said first and second portions are at an angle of at least 180°.

22. A hinge assembly according to claim 21, wherein said second portion is substantially planar.

23. A hinge assembly according to claim 21, wherein said first portion is substantially planar.

24. A hinge assembly according to claim 21, wherein said first portion, leg, lip and intermediate portion are substantially in the form of a four-sided polygon.

25. A hinge assembly according to claim 24, wherein said first portion and leg form a first set of opposed sides of said polygon, and
said lip and intermediate portion form a second set of opposed sides of said polygon.

* * * * *